United States Patent [19] [11] 3,909,265
Miyano et al. [45] Sept. 30, 1975

[54] PROCESS FOR PRODUCING PRESENSITIZED PLANOGRAPHIC PRINTING PLATE REQUIRING NO FOUNTAIN SOLUTION

[75] Inventors: Shizuo Miyano; Shinzo Kishimoto; Kenichiro Yazawa; Asaji Kondo, all of Asaka, Japan

[73] Assignee: Fuji Photo Film Co., Ltd., Minami-ashigara, Japan

[22] Filed: Dec. 12, 1973

[21] Appl. No.: 424,027

[30] Foreign Application Priority Data

Dec. 13, 1972 Japan.............................. 47-124913

[52] U.S. Cl. .............................. 96/33; 96/30; 96/31
[51] Int. Cl.$^2$......................... G03F 7/02; G03F 1/00
[58] Field of Search............................. 96/33, 30, 31

[56] References Cited

UNITED STATES PATENTS 3,606,922 9/1971 Doggett ................................. 96/33

*Primary Examiner*—Norman G. Torchin
*Assistant Examiner*—Alfonso T. Suro Pico
*Attorney, Agent, or Firm*—Sughrue, Rothwell, Mion, Zinn & Macpeak

[57] ABSTRACT

A process for producing a presensitized planographic printing plate requiring no fountain solution comprising the steps of:

a. providing a light-sensitive substance layer on a polyolefin film;

b. providing a silicone gum layer on a support;

c. pressing the polymer film of (a) and the support of (b) together so as to contact the light-sensitive substance layer and the silicone gum layer; and d. hardening the silicone gum to a silicone rubber while pressing the light-sensitive substance layer against the silicone gum layer.

9 Claims, 2 Drawing Figures

(1)

(2)

(3)

(4)

(5)

(6)

PROCESS FOR PRODUCING PRESENSITIZED PLANOGRAPHIC PRINTING PLATE REQUIRING NO FOUNTAIN SOLUTION

BACKGROUND OF THE INVENTION

1. Field of the Invention

The present invention relates to a process for producing a presensitized planographic printing plate requiring no fountain solution and, more particularly, it relates to a presensitized planographic printing plate requiring no fountain solution upon printing (hereinafter abbreviated as "dry presensitized plate") which comprises a support having thereon in turn a silicone rubber layer and a light-sensitive substance layer.

2. Description of the Prior Art

Printing methods using a dry presensitized plate simplify the conventional offset printing methods. In the conventional offset printing method, a presensitized planographic printing plate (hereinafter abbreviated as "presensitized plate") is exposed through a negative or positive original and is then processed using a suitable processing solution to form imagewise oleophilic areas and hydrophilic areas, thus forming a printing plate. In the thus prepared printing plate, the oleophilic areas are oily ink-receptive which form the image areas while hydrophilic areas are ink-repellent portions which form the non-image areas. One of the great disadvantages of this method is that operation of using fountain solution is extremely troublesome. A planographic plate printing method requiring no fountain solution has appeared as one solution for the above-described problem. This is a quite practical printing method in which an oily ink alone and no fountain solution is supplied, upon printing, to a printing plate having provided thereon a strongly ink-repellent silicone rubber layer. U.S. Pat. No. 3,606,922 describes the techniques for producing a dry presensitized plate for this method.

The principle of the method given in the above-described U.S. Pat. is as follows (1) A printing plate comprising a support having provided thereon in turn a silicone rubber layer, a diazo resin light-sensitive layer and a water-soluble polymer cover is prepared. (2) After exposing this plate through a negative film, the image is removed with a processing solution. At this occasion, the light-sensitive substance in the image areas is changed to become resistant to the processing solution while the non-image areas are easily removed with the processing solution to uncover the underlying silicone rubber layer. (3) When the resulting printing plate is inked with an ink roller, the image areas are inked while the non-image areas are not inked at all. Then, the ink thus adhered to the image areas alone is transferred to a blanket of the offset printer, and then transferred to a paper to provide excellent impressions.

In the production of a dry presensitized plate for this method, it is of importance to provide a silicone rubber layer between a support and a light-sensitive layer. In providing a light-sensitive layer on a silicone layer, the light-sensitive layer coating solution will be repelled, if a light-sensitive layer is merely coated according to a conventionally known coating method, such as doctor coating, roller coating, reverse roller coating, gravure coating, cast coating, etc., due to the inherent properties of silicone rubber. Thus, continuous, good films do not result from the coating. Even if a continuous film is partially formed, it will not show good adhesion to silicone rubber. Therefore, in order to solve this coating problem, a method has been employed in which a light-sensitive substance is initially coated on a polymer film and, after pressing the light-sensitive layer onto a non-hardened silicone gum layer separately prepared and coated on a support, the resulting assembly is heated or left at room temperature for a long time to adhere the light sensitive layer to the silicone rubber layer.

Heretofore, a diazo resin has been used as the light-sensitive substance. However, this resin does not form a uniform, good film. Therefore, double difficulties result in that it is necessary to provide initially a water-soluble polymer on a polymer film and then to apply thereto a diazo resin. Since the polymer film used at this occasion is something like silicone delaminating paper, it is also difficult to uniformly coat the water-soluble polymer thereon due to repellency, etc.

In the efficient production of a dry presensitized plate for this method, several important points are involved. That is: (1) the adhesion between the silicone rubber layer and the support thereof and between the silicone rubber layer and the light-sensitive layer must be strong enough to resist peeling during the development processing and the printing operation as well as during the mere handling of the Plate; (2) in order to handle the presensitized plate as soon as possible after coating, it is desirable for the silicone gum to rapidly harden to a silicone rubber (the terms "silicone gum" and "silicone rubber" as used herein are defined as a non-hardened polyorganosiloxane and a hardened polyorganosiloxane, respectively), which requires a means for forced heat-hardening; (3) a light-sensitive substance is coated on a polymer film and, after the light-sensitive substance is adhered to the silicone rubber layer, this polymer film is delaminated from the light-sensitive substance layer with ease, and the polymer film should have good gas permeability so that gaseous components produced upon hardening of the silicone gum by forced heating may pass therethrough. Where those films which lack this gas permeability are used as the polymer film, removal of the gaseous components will be so delayed that the hardening of the silicone rubber is markedly delayed, and the gas produced will form gaseous foams between the light-sensitive layer and the silicone, which results in extremely poor adhesive property.

It is, therefore, an object of the present invention to provide a process for producing a dry presensitized plate with efficiency and, ultimately, to provide a dry presensitized plate markedly improved over that described in U.S. Pat. No. 3,606,922.

SUMMARY OF THE INVENTION

As a result of various investigations to attain the abovedescribed objects, the inventors have achieved the present invention. That is, the present invention provide:

1. a process for producing a presensitized planographic printing plate requiring no fountain solution which includes the steps of:

a. providing a light-sensitive substance layer on a polymer film;

b. providing a silicone gum layer on a support;

c. pressing the light-sensitive substance layer onto the silicone gum layer; and d. hardening the silicone gum to a silicone rubber while pressing the light-sensitive substance and the silicone gum layer, together using a polyolefin film as the polymer film, 2. a process for producing a presensitized planographic printing plate requiring no fountain solution as described in (1) above, in which the silicone gum layer further contains a silicone primer or a silane coupling agent, and 3. a process for producing a presensitized planographic printing plate requiring no fountain solution as described in (1) above, in which a silicone primer layer or a silicone coupling agent layer is provided, after forming a silicone gum layer on the support, on the silicone gum layer.

BRIEF DESCRIPTION OF THE ACCOMPANYING DRAWINGS

DETAILED DESCRIPTION OF THE INVENTION

Figure 2:
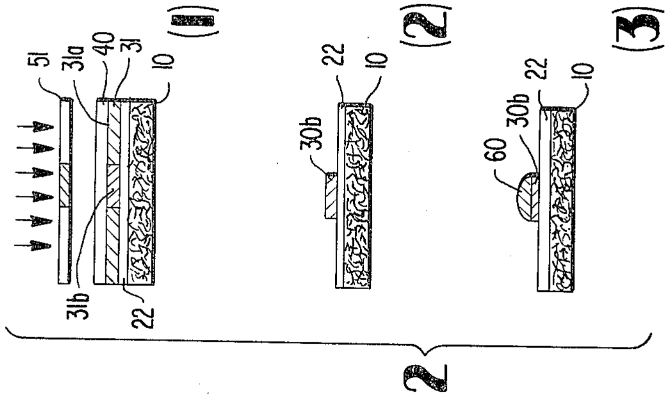
FIG. 2 shows vertical sectional views of the plates at the main steps for preparing a printing plate using a negative-type dry presensitized plate produced by the present invention.

A standard process for producing a dry presensitized plate in accordance with the present invention is described below.

First, an organic solvent solution such as a solution in toluene, benzene, monochlorobenzene, xylene, etc., of the light-sensitive substance is prepared and applied in a thickness of about 0.5 to 5 $\mu$, preferably 1.0 to 2.0 $\mu$ to a polyolefin film such as a polyethylene or polypropylene film, a polymer film having a thickness of about 10 to 70 $\mu$, preferably 20 to 25 $\mu$. The concentration of the light-sensitive substance employed will depend to some extent on the coating method but generally from 1 to 100%, preferably 10 to 50% by weight concentration is generally used. In this case, it is necessary to select as the coating solvent an organic solvent which is inert to the polyolefin, which wets the polyolefin well and dissolves the lightsensitive substance well. On this light-sensitive substance layer is coated, if necessary, a n-heptane, n-hexane, pentane, cyclohexane, naphtha, benzene, toluene or xylene or a mixture of these solvents, with aromatic solvents being preferred solution containing about 10% by weight of a silicone primer or a silane coupling agent, e.g., in a small amount of, for example, about 0.5 $\mu$ in thickness according to a cast-coating method, then dried. On the other hand, an aluminum plate for use in usual presensitized plates is separately prepared and a 50% by weight n-heptane solution of a silicone gum hardenable at room temperature (about 20° to 30°C) is uniformly applied thereto in a thickness of about 1 to 15 $\mu$, preferably 4 to 7 $\mu$ using a coating rod. After cooling, it is left for about 1 minute so that most of n-heptane can evaporate. Thereafter, the silicone gum-coated surface is pressed onto the light-sensitive substance layer provided on the polyolefin film or onto the silicone primer- or coupling agent-coated surface of the light-sensitive substance layer using a heat sealer heated to 120°C. The pressure employed are not critical and suitable pressures can be those used in conventional lamination methods. Then, in order to complete the hardening of the silicone gum, the silicone gum can be cured at a temperature of about 90°C to 150°C. However, where higher temperatures are employed the polyolefin tends to be softened and preferred temperatures are 90°C to 120°C. Heating for 5 to 10 minutes in an oven heated to 120°C can be suitably employed. Thus, the silicone gum is hardened and the light-sensitive substance layer and the silicone rubber are adhered to each other. When a silicone primer or a coupling agent is provided on the light-sensitive substance layer, the light-sensitive substance layer and the silicone rubber layer will be adhered more strongly to each other. When the polyolefin film is delaminated in this state, only the polyolefin film is peeled off, leaving the light-sensitive substance layer on the silicone rubber. However, it is preferable not to delaminate polyolefin film cover before actual use in order to protect the light-sensitive layer. In addition, when the polyolefin film is thinner than 10 microns, the resulting plate can be exposed through an original superposed thereon without removing the polyolefin film.

In the above-described process, a silicone primer layer is provided in the middle of the structure. Also, a silicone primer or a silane coupling agent can be incorporated directly in the silicone gum or the light-sensitive substance. Where the silicone primer is incorporated into the silicone gum layer, it can be incorporated in an amount of about 5 to 50% by weight, preferably 15 to 25% by weight. When the silicone primer or silicone coupling agent is incorporated into the light sensitive layer, a suitable amount is 5 to 50% by weight preferably 25 to 40% by weight. In such case, it is not necessary to provide a silicone primer on the light-sensitive substance layer. In addition, conveniently enough, this processing has the advantage that the hardening of the silicone gum is accelerated so much that the hardening is completed by heating at 120°C within 1 minute after press-contacting. Therefore, this process enables the use of light-sensitive substances which are comparatively unstable against heat, such as light-sensitive diazo resins and quinonediazindes.

The dry presensitized plate in accordance with the present invention has a layer structure comprising a support having provided thereon in turn a silicone rubber layer, a silicone primer or silane coupling agent layer (if desired), a light-sensitive layer and a polyolefin film (which functions later as a protective cover). The primer layer or silane coupling layer, which is provided if desired, is an adhesion-improving layer. This silicone primer or silane coupling agent can be incorporated in the silicone gum layer. As to the thickness of each layer, the silicone rubber layer preferably has a thickness of about 2 $\mu$ to 15 $\mu$, the primer coupling agent layer preferably has a thickness of a monomolecular thickness to less than 0.5 $\mu$ and the light-sensitive layer has a thickness of 0.5 $\mu$ to 5 $\mu$.

Figure 1:
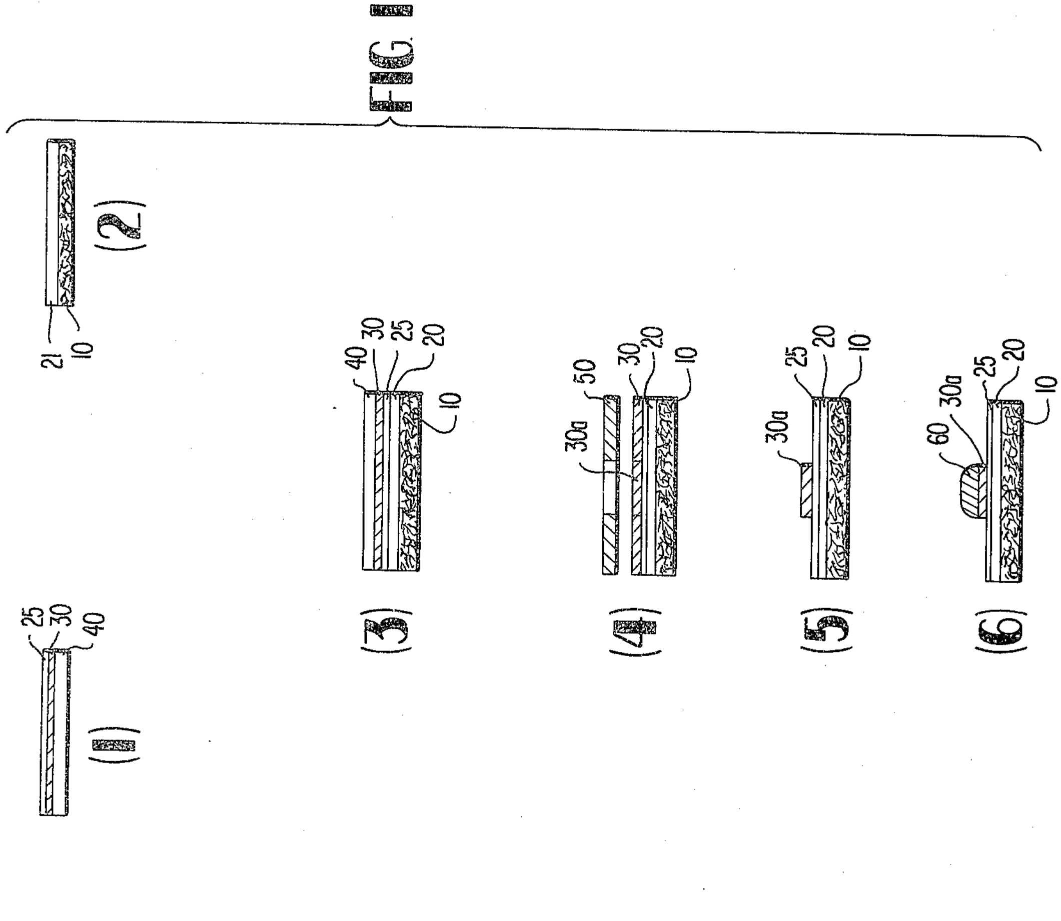
FIG. 1 shows illustrations of one embodiment of the process for producing a dry presensitized plate according to the present invention, and shows vertical sectional views of the plates at the main steps for preparing a printing plate using the dry presensitized plate.

FIG. 1 shows illustrations of one embodiment of the process of the present invention for producing a dry presensitized plate and shows vertical sectional views of plates at the main steps in the production of a printing plate using the dry presensitized plate. In FIG. 1, stage 1 shows the layer structure wherein a photo-hardenable light-sensitive substance layer 30 and a silicone primer or silane coupling agent layer 25 are provided in turn on a polyolefin film 40, and stage 2 shows the layer structure wherein a silicone gum layer 21 is provided on a support 10. Stage 3 shows the layer structure at the step where the silicone primer or silane coupling agent layer 25 of stage 1 is pressed onto the silicone gum layer 21 of stage 2 and the silicone gum layer is hardened to form silicone rubber layer 20. Stage 4 shows the state wherein the thus obtained dry presensitized plate is exposed through a negative after delaminating polyolefin layer 40. The light-struck portion 30*a* of the light-sensitive substance layer is hardened. When the plate is subjected to development processing, the unexposed area of the light-sensitive substance layer 30 is removed to provide a printing plate 5. Upon inking this printing plate, the ink 60 adheres only to the area 30*a* where the hardened light-sensitive substance layer remains as illustrated in stage 6.

FIG. 2 shows vertical sectional views of plates at main steps in the production of a printing plate using a negative-type dry presensitized plate produced according to the present invention. In FIG. 2, stage 1 shows the step where a negativetype dry presensitized plate comprising a support 10 having provided thereon in turn a silicone primer-containing silicone rubber layer 22, a photo-solubilizable light-sensitive substance layer 31 and a polyolefin film 40 is exposed through positive original 51. The exposed area 31*a* of the light-sensitive substance layer 31 is rendered developer-soluble by light. After delaminating the polyolefin film 40, the thus exposed dry presensitized plate is processed with a developer to remove the light-struck areas of the light-sensitive substance layer and uncover the underlying silicone rubber layer 22. Thus, a printing plate 2 is formed. Stage 3 shows the state of the plate being inked, where ink 60 adheres only to the image area.

Now, each of the elements to be used in the present invention will be described in detail below.

First, as the light-sensitive substance, any of those light-sensitive substances which are usable for conventional presensitized plates can be employed. As the light-sensitive substances for use in negative work in accordance with the present invention, diazo-type light-sensitive substances such as p-diazodiphenylamine derivatives, p-quinonediazides, etc., organic azides, polyvinyl cinnamyl compounds, polyvinyl cinnamylidene compounds, homopolymers or copolymers of cinnamoyloxyethyl acrylate or methacrylate, and the like can be used. In addition, photopolymerizable monomers such as the triacrylate of trimethylolpropane can also be used. Also, as the light-sensitive substances for dry presensitized plates for use in positive work in accordance with the present invention, o-quinonediazides, salts of p-diazodiphenylamine with hetero acids, and the like can be used. These light-sensitive substances can be used alone. However, where the light-sensitive substances have a poor film-forming ability, it is preferable to use them in combination with a binder. Also, the sensitivity thereof can be enhanced by using a suitable sensitizing dye such as michelers ketone.

Examples of photosensitive materials for negative work, for example, a diazo compound, are described in U.S. Pat. Nos. 2,649,373; 2,714,066; 3,751,257; and the p-quinone diazides are described in U.S. Pat. Nos. 2,754,209; 2,975,053; 2,994,608; 2,995,442; and 3,029,146.

Example of photosensitive materials for positive work, for example, o-quinone diazides, are described in U.S. Pat. Nos. 2,772,972; 2,767,092; 2,766,118; 2,859,112; 2,907,655; 3,046,110; 3,046,113; 3,046,112; 3,046,113; 3,046,114; 3,056,115; 3,046,116; 3,046,118; 3,046,119; 3,046,121; 3,046,122; 3,046,123; 3,046,124; 3,061,430; and 3,106,465.

A preferred o-quinone diazide is an ester of 2-diazo-1-naphthol-4-sulphonic acid and an ester of 2-diazo-2-naphthol-5-sulphonic acid, in which the ester group is the residue of a polymeric phenol obtained by the interaction of a polyhydric phenol and a ketone. The polymeric phenol is preferably a product obtained by the reaction of acetone with pyrogallol at room temperature in the presence of a catalyst such as phosphorous oxychloride. The reaction molar ratio of the acid chloride to the polymeric phenol can range from about 1:0.6 to about 1:2, with preferred ratios being about 1:1 to about 1:1.8.

Next, light-sensitive unsaturated polyesters which have provided particularly preferable results in the present invention will be described below. However, this description does not limit the present invention in any way.

Such light-sensitive polyesters are disclosed by U.S. Pat. No. 3,707,373. They are the polycondensation product formed by an ester interchange reaction between the methyl ester of p-phenylenediacrylic acid and a polyhydric alcohol having a cyclohexyl group in the molecule. To be specific, the unsaturated polybasic acid component includes methyl p-phenylenediacrylate, etc., and the polyhydric alcohol component is selected from those having a cyclohexyl group therein, such as 1,4-dihydroxyethyloxycyclohexane, 1,4-cyclohexanediol, 1,4-cyclohexanedimethanol, etc. The polymer produced by the polycondensation therebetween should have the molecular weight of 1,000 to several 10,000. As the solvent for such a polymer, halogenated hydrocarbons, aromatic compounds such as toluene, benzene, etc., γ-butyrolactone, and the like can be used.

The sensitivity of the light-sensitive unsaturated polyester can be greatly enhanced using a sensitizer. Such sensitizers are 1-methyl-2-benzomethylene, β-naphthothiazoline, methyl-2-(N-methyl-benzothiazolidene), dithioacetate, etc. These are preferably used in a proportion of 1 to 7% by weight based on the weight of the light-sensitive polyester.

On the other hand, the silicone gum which can be used in the present invention is an unhardened linear polyorganosiloxane having a mean molecular weight of about 10,000 to 100,000 which contains residual unreacted terminal functional groups and is therefore hardenable under suitable conditions. The silicone rubber is a polyorganosiloxane in which the hardening has proceeded and which has a mean molecular weight of about 400,000 to 800,000 as a result of the reaction of the terminal groups in the silicone gum and has a very slight cross linking structure. The silicone gum and silicone rubber can be physically discriminated from each other since the former is soluble in organic solvents such as halogenated hydrocarbons, ketones, esters, aromatics, etc., while hardened silicone rubber is completely insoluble in these solvents.

In general there are two types of silicone gums: a one-package type silicone gum (the so called "one shot" silicone gum) and a two-package type silicone gum (the so-called "two shot" silicone gum). In the present invention, any of acetic acid-releasing silicone gums (deacetic acid type), oxime-releasing silicone gums (de-oxime type), alcohol-releasing silicone gums (de-alcohol type) and amine-releasing silicone gums (de-amine type) can be used of the one-package type silicone gums capable of being hardened at room temperature. These one-package type silicone gums can also be used in combination with a two-package type silicone gum. A suitable proportion ranges from 80:20 to 20:80% by weight, preferably 65:35 by weight.

These gums are hardened to silicone rubbers by leaving them at room temperature for a long time. From the viewpoint of production, however, it is preferable to harden the gum in a short time and at a temperature as low as possible. As described above the single package-type silicone gum includes those having dimethylpolysiloxane chains terminated by acetyl, oxime, alkyl or amino groups. More specifically, the single package-type silicone gum is a linear compound which has repeating units of the following general structure

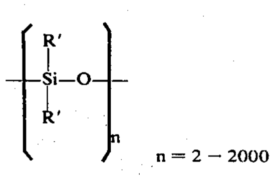

$R^1$, which can be the same or different, is a monovalent alkyl or aryl group, or a cyanoaryl group. Generally less than 2 to 3 molar % of the R' groups are vinylphenyl or halovinyl or phenyl, but most usually essentially, R' is a methyl group.

These silicone gums contain the following terminal groups

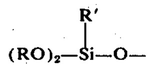

where R is an alkyl group having 1 to 3 carbon atoms, and R' is as described above;

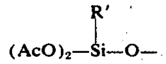

where Ac is an acetyl group and R' is as described above;

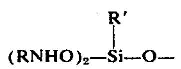

where R is an alkyl group having 1 to 3 carbon atoms and R' is as described above; and

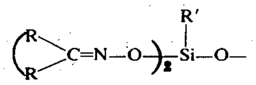

where R is an alkyl group having 1 to 3 carbon atoms and R' is as described above.

The single package type silicone gum becomes a silicone rubber of high molecular weight upon curing by hydrolysis (at the above described terminal groups). Upon hydrolysis, the compounds eliminated are acetic acid, an alcohol, an oxime, etc., depending on the substituent terminal group. Depending upon the released components, the commercially available silicone gums are classified into four types: de-acetic acid-type, de-oxime-type, de-alcohol-type and deamination-type. A de-alcohol type is preferred. The de-acetic acid-type is commercially available as KE-41RTV (RTV is an abbreviation of Room Temperature Vulcanization) and KE-42RTV supplied by Shin-etsu Chemical Industries Co., Ltd., SH-781RTV, SH-9731RTV, SH-9732RTV, SH-9737RTV and SH-9140RTV supplied by Toray-Silicone Co., with these types having the general formula

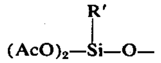

wherein R is alkyl ($C_1 - C_3$), and Ac is acetyl, the de-oxime-type is commercially available as KE-44RTV and KE-45RTV supplied by Shin-etsu Chemical Industries Co., Ltd. and SH-780-RTV and PRX-305 dispersion supplied by Toray-Silicone Co. these silicone rubbers having the general formula

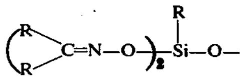

where R is alkyl ($C_1 - C_3$), the de-alcohol-type is commercially available as DC-2140RTV supplied by Dow-Corning Co. and Silaseal E supplied by Fuji Kobunshi Co., Ltd., and the deamination-type is commercially available as Elastseal 33, Elastseal 34, Elastseal 50 and Elastseal 59 supplied by Wacker Chemie Co., with these types having the general formula

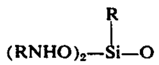

wherein R is alkyl ($C_1 - C_3$).

The two package addition reaction type silicone gum generally, cures in accordance with the following reaction schematic

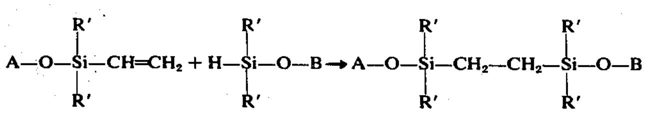

or the following reaction schematic

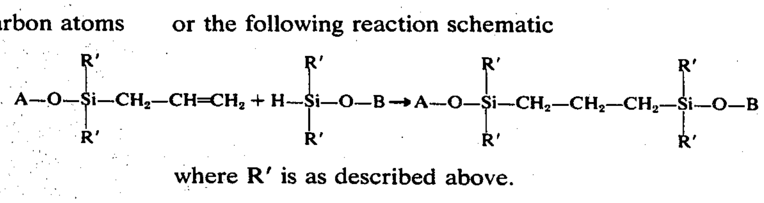

where R' is as described above.

In the above, the symbols A and B have been used to represent the organosiloxane residue bonded to these addition polymerizing type terminal groups. A and B can be the same or different and their composition can vary since the essential characteristic of these organosiloxanes is in the terminal groupings which are addition polymerizable, in which palladium or platinum compounds are used as a catalyst and due to addition polymerization between, the unsaturated groups such as a vinyl group or allyl group and the

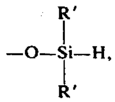
, moiety the gum crues.

Thus, the so called two-package type silicone gum is one in which the catalyst and the siloxane are separate and are mixed when used.

A specific example of the two package addition reaction type silicone gum comprises a mixture, as one component, of an organopolysiloxane having a vinyl group in the molecule and an organohydrogenpolysiloxane, e.g., a mixture of compounds having terminal groups of the following general formula

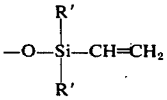

terminal group of polyorganosiloxane

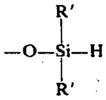

terminal group of organohydrogenpolysiloxane wherein R′ is as previously described, and a catalyst, as another component, such as a platinum compound or a palladium compound. $H_2PtCl_6$ is often used as a catalyst. The two components are combined together immediately before use.

The addition type silicone gums commercially available include KE-103RTV, KE-106RTV and KE-1300RTV supplied by Shinetsu Chemical Industries Co., Ltd., and SH-9555RTV supplied by the Toray-Silicone Co., in which R′ is alkyl ($C_1 - C_3$).

Silicone primers which can be used in the present invention are those which contain as the main component variously modified carbon functional silanes. For example, there are those prepared by dissolving in a non-polar solvent a low molecular weight silane compound such as the alkyl silanols, the ester derivatives thereof, organoalkoxysilanes (e.g., alkoxysilanes having a glycidoxypropyl group), vinyltrichlorosilanes, etc. Of these, PRX-304, SH-506, SH-4094, SH-1800, SH-2260 (trade name, made by the Toray Silicone Co.) and Primer ME-11 (trade name, made by the Tokyo Shibaura Electric Co., Ltd.) are particularly preferable.

These silane primer compounds have organic groups of two kinds of different reactivity, for example:

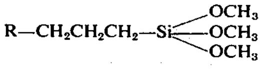

where R can be, for example, an alkyl group, an alkylamino group, an aminoalkyl group, an amino group, an alkoxyaryl group, a methacryloxy group, a glycidoxy group, a cycloalkyl group, and the like.

$CH_2{=}CH{-}SiCl_3$ (Vinyltrichlorosilane);

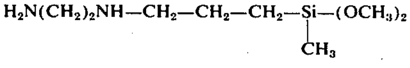
(N-Dimethoxymethyl silylpropyl) ethylenediamine);

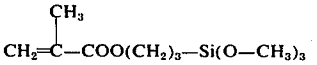
(γ-Methacryloxypropyl Trimethoxysilane);

$CH_3{-}Si(OCH_3)_3$ (Methyl Trimethoxysilane);

$C_6H_5Si(O{-}CH_3)_3$ (Phenyl Trimethoxysilane);

$CH_2{=}CH{-}Si(OCO{-}CH_3)_3$ (Vinyltrisacetoxysilane);

$Cl{-}(CH_2)_3{-}Si(OCH_3)_3$ (3-Chloropropyl Trimethoxysilane);

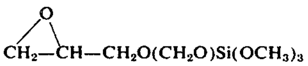
(γ-Glycidoxymethoxy Trimethoxysilane);

$CH_2{=}CH{-}Si(OC_2H_4OCH_3)_3$ (Vinyltrismethoxyethoxysilane);

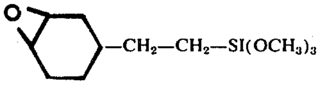
β-(3,4 Epoxycyclohexyl)-ethyl Trimethoxysilane;

and

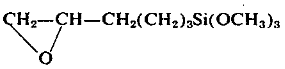
(γ-Glycidoxypropyltrimethoxysilane).

The silane coupling agent which can be used in the present invention has the following structure;

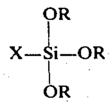

wherein R represents a $C_1$ to $C_9$ alkyl group, X represents a $C_1$ to $C_{18}$ aminoalkyl group or the like. Representative examples of R include a methyl group, an ethyl group, a propyl group, a butyl group, a pentyl group, a hexyl group, a heptyl group, an octyl group, a nonyl group, etc. (which may be straight chained or branched chained). Representative examples of X include an aminoethyl group, an aminopropyl group, an aminohexyl group, an aminodecyl group, an aminooctyldecyl group, an aminoethylaminopropyl group, a methylpropionylaminoethylaminopropyl group, etc. Representative silane coupling agents also include those represented by the following formulae:

$H_2N(CH_2)_3—Si(OCH_2CH_3)_3$; $CH_2═CHSiCl_3$;

$Cl—(CH_2)_3Si(OCH_3)_3$;

$H_2N(CH_2)_2NH(CH_2)_3—Si(OCH_3)_3$; $CH_2—CH$-

$CH_2O(CH_2O_2)Si(OCH_3)_3$;

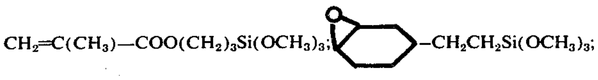

$H_2N(CH_2)_2NHCH_2CH(CH_3)—CH_2—Si(CH_3)—(OC_2H_5)_2$;

Commercially available silane coupling agents are: SH-6020, SH-6030, SH-6040, SH-6070, SH-6071, SH-6075 (trade name made by the Toray Silicone Co.), KBM-303, KBM-403, KBM-503, KBM-603, KA-1003, KBE-1003, KBC-1003 (trade names by Shinetsu Chemical Industries Co., Ltd.).

The polyolefin film which can be used in the present invention will now be described below. This polyolefin film is a most important feature of the present invention, and has the following properties. (1) A solution of light-sensitive substance can be coated on the film as a uniform layer. (2) The film does not undergo any dimensional change due to the coating solvent. (3) The film has high gas-permeability. This high gas-permeability property is extremely important since gases produced upon heating, such as vaporized residual solvent and those gases which are produced upon hardening of the silicone gum (e.g., acetic acid, alcohol, oxime, amine, etc.), must be released through the film so as to harden the silicone gum in a short period of time. If this vaporization is delayed, the hardening of the silicone gum will naturally be delayed greatly. If the plate is heated so as to accelerate the hardening, and if air spaces or bubbles between the light-sensitive layer and the silicone gum layer remain, this results in very poor adhesion. (4) After completely adhering the light-sensitive substance to the silicone rubber layer, delamination of the polyolefin from the light-sensitive layer to transfer the light-sensitive layer to the silicone layer can be easily accomplished. (5) The polyolefin functions as a protective cover for the light-sensitive layer.

As the specific polyolefin films, there are, for example, polypropylene, polyethylene, copolymers of polypropylene and polyethylene, and like polyolefin films. These have a nitrogen gas permeability of not less than 0.2 g/m²·24 hr·1 atm.

On the other hand, polyester, polyamide, polyvinylidene chloride, polyvinyl chloride, and the like have such poor gas permeability that the dry presensitized plate intended can not be obtained therefrom. In this connection, the gas permeability P of these films to nitrogen, oxygen and carbon dioxide gas is given in the following table.

| Polymer | $N_2$ °C | $N_2$ P | $O_2$ °C | $O_2$ P | $CO_2$ °C | $CO_2$ P |
|---|---|---|---|---|---|---|
| Cellulose Acetate | 30 | 0.28 | 30 | 0.78 | 30 | 2.38 |
| 6-Nylon (polyamide) | 30 | 0.0095 | 30 | 0.038 | 20 | 0.08 |
| Mylar* (polyester) | 30 | 0.011 | 30 | 0.045 | 30 | 0.15 |
| Polyethylene (low density) | 30 | 1.36 | 30 | 3.95 | 30 | 16.7 |
| Polypropylene | 30 | 0.44 | 30 | 2.3 | 30 | 9.2 |
| Saran** (polyvinylidene chloride | 30 | 0.00094 | 30 | 0.0053 | 30 | 0.03 |
| Polyvinyl chloride | 30 | 0.11 | 30 | 0.3 | 30 | 1.5 |

*trade name, of E.I. du Pont de Nemours
**trade name, of the Dow Chemical Co.

Gases produced in the process of the present invention are formed from solvents used in coating the silicone gum, such as n-heptane, and those produced upon hardening the silicone gum, such as acetic acid, alcohol, amine, oxime, etc. Although these gases are different from the nitrogen, oxygen and carbon dioxide given in the above table, there is in general correlation between these gases in gas permeability. Therefore, comparison of these numerical values reveals that polyolefinic films are the most suitable. In the case of polyolefin film, a non-stretched one can be used. However, from the viewpoint of dimensional stability and strength, bi-axially stretched films are more preferable. As to the thickness of the film, those having the thickness of 10 microns to 70 microns were examined and good results were obtained in every case. Polypropylene film and polyethylene-laminated polypropylene film can also be used. Polyolefin films not having been subjected to surface treatment such as corona discharge provided better results in delamination from the light-sensitive substance layer.

As the support which can be used in the present invention, all of those which are used for conventional presensitized plates can be used. For example, metal plates such as an aluminum plate; high polymer films such as polyester film; papers laminated with polyethylene or aluminum foil; and the like are suitable. These can be used both with and without surface processing.

The process for producing the dry presensitized plate of the present invention includes three steps: the step of exposing for about 60 to 180 seconds, preferably 70 to 120 seconds to irradiation from a carbon arc lamp, a mercury lamp, a xenon lamp, etc., through a halftone negative or a halftone positive prepared from an original; the step of development-processing of the plate using processing chemicals then washing with water; and the step of drying the resulting plate.

Needless to say, the processing solution can be variously selected depending upon the properties of the light-sensitive substance used and the binder therefor.

The features of the dry presensitized plate of the present invention and the process for producing the plate are enumerated below.

1. Since a polyolefin film has excellent gas permeability, the silicone gum can be hardened to a silicone rubber within an extremely short period of time.

2. Since a light-sensitive substance layer is provided on the silicone rubber layer, comparatively mild development processing solutions can be used, which minimizes environmental pollution problems.

3. The transparent polyolefin film can be utilized per se as a protective cover to protect the surface of the dry presensitized plate.

4. Where a thin polyolefin film is used, it can be removed after conducting exposure.

The present invention will now be illustrated in greater detail by reference to the following non-limiting examples of preferred embodiments of the present invention. Unless otherwise indicated, all parts and percents are by weight.

EXAMPLE 1

4 Grams of a light-sensitive unsaturated polyester, obtained by the 1:1 polycondensation of p-phenylene diacrylate and 1,4-dihydroxyethyloxycyclohexane, and 0.2 g of a sensitizing dye (1-methyl-2-benzomethylene-$\beta$-naphthothiazoline) were dissolved in 36 ml of toluene to prepare a light-sensitive solution. This solution was uniformly coated on a 20 $\mu$-thick polypropylene film (Torephan BO- No. 2500, made by Toray Industries, Inc.) using a No. 20 coating rod. After drying, a 10% by volume n-heptane solution of a silicone primer (Toray Silicone Primer PRX-304) was coated thereon and dried at a room temperature.

Separately, a solution prepared by dissolving 20 g of a one-liquid type silicone gum capable of being hardened at room temperature (KE-41RTV, made by Sinetsu Chemical Industries Co., Ltd.) in 26 ml of n-heptane was applied to an aluminum support using a No. 20 coating rod. After evaporating most of the coating solvent, the light-sensitive polyester-coated surface of the above-described polypropylene film was pressed onto the silicone gum coated surface of the aluminum support using rollers. In order to accelerate the hardening, the assembly was heated at 120°C for 5 minutes. Thus, a dry presensitized plate was obtained.

All of the above-described procedures were conducted under a safe light. After delaminating the polyolefin film from this dry presensitized plate, this plate was exposed for 90 seconds through a negative film using a printer, Plano PSA-3, made by the Fuji Photo Film Co., Ltd. and then subjected to development processing using a 30% aqueous solution of $\gamma$-butyrolactone. Thus, the light-sensitive substance at the unexposed areas or the non-image areas was dissolved out to uncover the underlying silicone rubber layer, whereas the light-sensitive substance at the exposed areas or the image areas underwent no change and remained on the silicone rubber layer as the oleophilic portions.

When printing was conducted using the resulting printing plate by inking with "Speed King Black" ink (made by the Toyo Ink Mfg. Co., Ltd.) using an offset press, Davidson Dualith-Type 500 (from which the mechanism for applying fountain solution had been removed), 50,000 printed sheets were obtained. The printing plate suffered no damage.

EXAMPLE 2

The same light-sensitive solution as used in Example 1 was uniformly coated on a 20 $\mu$-thick polypropylene film, Torephan BO No. 2300 using a No. 20 coating rod.

Separately, a solution prepared by dissolving 20 g of SH-781RTV (made by the Toray Silicone Co.) and 4 g of Primer PRX-304 (made by the Toray Silicone Co.) in 20 g of n-heptane was uniformly coated on an aluminum support using a No. 20 coating rod. In a manner similar to Example 1, the above-described polypropylene film was pressed onto the aluminum support using rollers, and the resulting assembly was heated at 120°C for 1 minute to accelerate the hardening of the silicone gum. Thus, the light-sensitive layer adhered to the silicone rubber layer. The thus obtained dry presensitized plate also provided a good printing plate after exposure and development.

EXAMPLE 3

In a manner similar to Example 1 except for using a 20 $\mu$-thick, polyethylene-laminated polypropylene film (Kapora BPE-9, made by Kaito Kagaku) in place of the polypropylene film used in Example 1, a presensitized plate requiring no fountain solution similar to Example 1 was obtained.

EXAMPLE 4

A coating solution prepared by dissolving 2 g of o-quinone-diazide resin and 1 g of Epon-1031 (an epoxy resin made by Shell Chemical Corp.) (as the binder for the resin) in 40 g of a mixed solution of cyclohexane and methyl ethyl ketone (1:1 by volume) was applied to a 30 $\mu$-thick polypropylene film, Torephan BO- No. 2500, in an amount of 6 g per 1,000 $cm^2$ and dried to form a light-sensitive substance layer.

Separately, a solution prepared by dissolving 20 g of a one-liquid type silicone gum, KE-41RTV (made by the Shin-etsu Chemical Industries, Co., Ltd.), and 4 g of Primer PRX304 (made by the Toray Silicone Co.) in 20 g of n-heptane was uniformly coated on an aluminum support using a No. 20 coating rod. In a manner similar to Example 1, the coated surfaces were pressed onto each other using rollers and the resulting assembly was heated at 120°C for 1 minute to accelerate the hardening of the silicone gum. Thus, the light-sensitive layer adhered to the silicone rubber layer to obtain a good dry presensitized plate for positive work.

EXAMPLE 5

In a manner similar to Example 4, except for using a

20 $\mu$-thick polystyrene film in place of the polypropylene film, a good, positive-type dry presensitized plate was obtained.

Comparative Example 1

The same procedures as described in Example 1 were conducted using a 10 $\mu$-thick polyethylene terephthalate film in place of the polypropylene film. However, upon heating, air spaces or bubbles between the light-sensitive layer provided on the polyethylene terephthalate film and the silicone gum layer provided on the aluminum support. Moreover, the silicone gum was not hardened even after 3 days. Thus, a good dry presensitized plate was not obtained.

Comparative Example 2

The same procedures as described in Example 1 were conducted using a corona discharge-processed polypropylene film in place of the polypropylene film. Although the silicone gum was hardended satisfactorily, the light-sensitive layer could not be delaminated with ease from the polyolefin film. Thus, a good presensitized plate was not obtained.

While the invention has been described in detail and with reference to specific embodiments thereof, it will be apparent to one skilled in the art that various changes and modifications can be made therein without departing from the spirit and scope thereof.

What is claimed is:

1. A process for producing a presensitized planographic printing plate requiring no fountain solution comprising the steps of:

a. providing a light-sensitive substance on an unsupported polyolefin film having a nitrogen gas permeability of not less than 0.2 g/m$^2$·24 hr. .1 atm.;
b. providing a silicone gum layer on a support;
c. contacting said light-sensitive substance layer and said silicone gum layer; and
d. hardening said silicone gum to a silicone rubber while pressing said light-sensitive substance layer against said silicone gum layer.

2. The process for producing a presensitized planographic printing plate as described in claim 1, wherein said silicone gum layer further contains a silicone primer or a silane coupling agent.

3. The process for producing a presensitized planographic printing plate as described in claim 1, wherein said process comprises providing a silicone primer layer or a silane coupling agent layer on said silicone gum layer on said support.

4. The process for producing a presensitized planographic printing plate as described in claim 1, wherein said lightsensitive substance is a diazo compound, an organic azide, a polyvinyl cinnamyl compound, a polyvinyl cinnamylidene compound, a homopolymer or a copolymer of cinnamoyloxyethyl acrylate or methacrylate or the triacrylate of trimethylolpropane.

5. The process for producing a presensitized planographic printing plate as described in claim 1, wherein said silicone gum layer comprises a one-package silicone gum or a mixture of a one-package silicone gum and a two-package addition polymerizable silicone gum.

6. The process for producing a presensitized planographic printing plate as described in claim 1, wherein said polyolefin film is a polyethylene film, a polypropylene film, or a film of a copolymer of polypropylene and polyethylene.

7. The process for producing a presensitized planographic printing plate as described in claim 1, wherein said silicone rubber layer has a thickness of about 2 microns to 15 microns, wherein said light-sensitive substance layer has a thickness of about 0.5 micron to 5 microns and wherein said polyolefin film has a thickness of about 10 to 70 microns.

8. The process for producing a presensitized planographic printing plate as described in claim 3, wherein said silicone rubber layer has a thickness of about 2 microns to 15 microns, wherein said light sensitive substance layer has a thickness of about 0.5 micron to 5 microns, wherein said silicone primer layer or said silane coupling agent layer has a layer thickness ranging from monomolecular thickness to less than 0.5 micron and wherein said polyolefin film has a thickness of about 10 microns to 70 microns.

9. The process of claim 1 further comprising the steps of removing the polyolefin film from the light-sensitive substance layer just prior to exposure of said light-sensitive substance layer.

* * * * *